（12） United States Patent
Grede et al.

(10) Patent No.: US 10,396,720 B2
(45) Date of Patent: Aug. 27, 2019

(54) HIGH-FREQUENCY AMPLIFIER APPARATUSES

(71) Applicant: TRUMPF Huettinger GmbH + Co. KG, Freiburg (DE)

(72) Inventors: Andre Grede, Freiburg (DE); Alexander Alt, Freiburg (DE); Daniel Gruner, Muellheim (DE); Anton Labanc, Ehrenkirchen (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 0 days.

(21) Appl. No.: 15/855,584

(22) Filed: Dec. 27, 2017

(65) Prior Publication Data

US 2018/0123526 A1 May 3, 2018

Related U.S. Application Data

(63) Continuation of application No. PCT/EP2016/065385, filed on Jun. 30, 2016.

(30) Foreign Application Priority Data

Jun. 30, 2015 (DE) ........................ 10 2015 212 220

(51) Int. Cl.
*H03F 1/00* (2006.01)
*H03F 1/30* (2006.01)
(Continued)

(52) U.S. Cl.
CPC ......... *H03F 1/301* (2013.01); *H01F 27/2804* (2013.01); *H01J 37/32174* (2013.01);
(Continued)

(58) Field of Classification Search
CPC .... H03F 3/191; H03F 3/193; H03F 2200/534; H03F 2200/537; H03F 2200/541
(Continued)

(56) References Cited

U.S. PATENT DOCUMENTS 4,107,728 A * 8/1978 Max ...................... H01L 23/057
257/664
5,015,972 A 5/1991 Cygan et al.
(Continued)

FOREIGN PATENT DOCUMENTS

| CA | 2556839 | 2/2007 |
|---|---|---|
| JP | 4271457 | 6/2009 |
| WO | WO 2017/001602 | 1/2017 |

OTHER PUBLICATIONS

AN 10967 BLF578 352 MHz 1 kW demo board, NXP Semiconductors, 2012, 10 pages.
(Continued)

*Primary Examiner* — Steven J Mottola
(74) *Attorney, Agent, or Firm* — Fish & Richardson P.C.

(57) ABSTRACT

High-frequency amplifier apparatuses suitable for producing output powers of at least 1 kW at frequencies of at least 2 MHz for plasma excitation are disclosed. These high-frequency amplifiers include two transistors, the source or emitter connections of which are each connected to a ground connection point. The transistors can have an identical design and are arranged on a multilayer printed circuit board. The apparatus also includes a power transformer, the primary winding of which is connected to the drain or collector connections of the transistors. The primary winding and the secondary winding of the power transformer are each in the form of planar conductor tracks which are arranged in different upper layers of the multilayer printed circuit board.

19 Claims, 3 Drawing Sheets

(51) Int. Cl.

| | |
|---|---|
| *H01F 27/28* | (2006.01) |
| *H01J 37/32* | (2006.01) |
| *H03F 3/193* | (2006.01) |
| *H03F 3/30* | (2006.01) |
| *H03F 1/56* | (2006.01) |
| *H03F 3/21* | (2006.01) |
| *H05K 1/02* | (2006.01) |
| *H05K 1/16* | (2006.01) |
| *H05K 1/18* | (2006.01) |

(52) U.S. Cl.
CPC ............ *H03F 1/565* (2013.01); *H03F 3/193* (2013.01); *H03F 3/21* (2013.01); *H03F 3/3001* (2013.01); *H05K 1/0243* (2013.01); *H05K 1/165* (2013.01); *H05K 1/18* (2013.01); *H01F 2027/2809* (2013.01); *H01F 2027/2819* (2013.01); *H03F 2200/451* (2013.01); *H05K 2201/10166* (2013.01)

(58) Field of Classification Search
USPC ...................................... 330/65–68, 165, 195
See application file for complete search history.

(56) References Cited

U.S. PATENT DOCUMENTS

| | | | |
|---|---|---|---|
| 5,835,367 | A | 11/1998 | Pan et al. |
| 6,603,383 | B2 | 8/2003 | Gevorgian et al. |
| 6,879,209 | B2 | 4/2005 | Grundlingh |
| 7,221,102 | B2 | 5/2007 | Kotani et al. |
| 7,605,673 | B2 | 10/2009 | Robotham, Jr. et al. |
| 7,768,371 | B2 | 8/2010 | Hui et al. |
| 8,344,801 | B2 | 1/2013 | Owen et al. |
| 2003/0020583 | A1 | 1/2003 | Hui et al. |
| 2007/0030659 | A1 | 2/2007 | Suzuki et al. |
| 2007/0152751 | A1* | 7/2007 | Do .......................... H03F 3/19 330/165 |
| 2008/0272875 | A1 | 11/2008 | Huang et al. |
| 2009/0027936 | A1 | 1/2009 | Glueck et al. |
| 2010/0148866 | A1 | 6/2010 | Lee et al. |
| 2011/0241781 | A1 | 10/2011 | Owen et al. |
| 2013/0038226 | A1 | 2/2013 | Labanc |
| 2014/0361690 | A1 | 12/2014 | Yamada et al. |

OTHER PUBLICATIONS

AXIEM White Paper Modeling a Printed VHF Balun Leveraging EM Simulation Techniques, AWR Corporation, 2014, 10 pages.
BLF888A; BLF888AS—UHF power LDMOS transistor, NXP Semiconductors, Nov. 2013, 18 pages.
Buccella et al., "A computational method of temperature distribution in high frequency planar transformers," Industrial Electronics (ISLE), 2011, 477-482.
International Search Report and Written Opinion in International Application No. PCT/EP2016/065385, dated Nov. 10, 2016, 26 pages (with English translation).
Majid et al., "High frequency half-bridge converter using multilayered careless Printed Circuit Board step-down power transformer," 8$^{th}$ International Conference on Power Electronics—ECCE Asia, May 30-Jun. 3 2011, 1177-1181.
Motorola Semiconductor application note—AN749 Broadband transformers and power combining techniques for RF, RF Application Reports, Motorola, 1993, 10 pages.
Raab et al., "RF and Microwave Power Amplifier and Transmitter Technologies—Part 2," High Frequency Electronics, May 2003, 22-36.
Raab, "Broadband Class-E Power Amplifier for HF and VHF," Microwave Symposium Digest, 2006, 902-905.
Raab, "Analysis of second-harmonic-peaking power amplifier," Green Mountain Radio Research.Company, 1982, 6 pages.
Raab, Fundamental limitations in class-E and class-F power amplifiers, Green Mountain Radio Research Company, Mar. 1988, 14 pages.
RF Power LDMOS Transistors, Freescale Semiconductor Technical Data, 2014, 24 pages.
Saleem et al., "High frequency full bridge converter using multilayer careless printed circuit board step up power transformer," Circuit Theory and Design, 2011, 805-808.
Schauwers et al., "Planar transformer technology applied to AC/DC conversion," Telecommunication Energy Conference, 1999, 6 pages.
Wang et al., "Design of a planar power transformer for high voltage, high frequency use," Transmission and Distribution Conference and Exposition, 2010, 6 pages.

* cited by examiner

HIGH-FREQUENCY AMPLIFIER APPARATUSES

CROSS-REFERENCE TO RELATED APPLICATIONS

This application is a continuation of and claims priority under 35 U.S.C. § 120 from PCT Application No. PCT/EP2016/065385 filed on Jun. 30, 2016, which claims priority from German Application No. DE 10 2015 212 220.4, filed on Jun. 30, 2015. The entire contents of each of these priority applications are incorporated herein by reference.

TECHNICAL FIELD

The invention relates to high-frequency amplifier apparatuses that are suitable for generating an output power of at least 1 kW at frequencies of at least 2 MHz for plasma excitation.

BACKGROUND

High-frequency amplifier apparatuses are used for generating power that is suitable for exciting plasma. In these apparatuses, it is known to use transistors, such as bipolar transistors or Laterally Diffused metal Oxide Semiconductor (LDMOS) transistors. For plasma excitation, it is desirable to operate the high-frequency amplifier apparatus in class F or inverse class F amplifier operation.

But in these cases, a significant amount of heat may build up. For example, if power is reflected by a load, it converts into heat in the high-frequency amplifier apparatus. Different amplifier apparatuses are disclosed, for example, in the following documents: US 2009/0027936 A1, US 2010/0148866 A1, U.S. Pat. Nos. 7,221,102 B2, 5,835,367 A, US 2008/0272875 A1 and US 2013/0038226 A1.

SUMMARY

The present disclosure provides high-frequency amplifier apparatuses that can operate without fans even in continuous wave operation. These apparatuses are suitable for generating output power of at least 1 kW (kilowatt) at frequencies of at least 2 MHz (Megahertz) for plasma excitation. Each of these apparatuses includes two transistors. Each transistor includes a first terminal and a second terminal. The first terminals can be drain terminals or collector terminals. The second terminals can be source terminals or emitter terminals. The two transistors are each connected to a ground connection point by their respective source terminals or emitter terminals (the second terminals). The transistors can be designed to be of the same type. The transistors are arranged on a multi-layered circuit board. Each apparatus also includes a power transformer, of which the primary winding is connected to the drain terminals or collector terminals of the transistors (the first terminals). The primary winding and the secondary winding of the power transformer are each designed as planar conductor paths, which are arranged in different upper layers of the multi-layered circuit board.

In some implementations, two bipolar transistors or two LDMOS transistors are used as the transistors. These transistors are suitable for push-pull operation.

In the present disclosure, an upper layer of the multi-layered circuit board is understood to mean a layer that is not the lowermost layer of the circuit board. For example, the planar conductor paths of the primary winding and the secondary winding can be embedded in the circuit board material and be positioned in different planes, i.e., can be spaced apart from one another and the circuit board material can be arranged between the conductor paths. An arrangement of this type allows for good heat dissipation. Furthermore, this type of arrangement makes it possible that in the ideal push-pull operation for "differential mode" signals, the fundamental wave and odd harmonics are excited exclusively in a differential mode and even harmonics are excited exclusively in a common mode. A fundamental wave, as used herein, is the high-frequency signal generated by the high-frequency amplifier apparatus at a given fundamental frequency (which is the operating frequency of the high-frequency amplifier apparatus).

By selecting the winding ratio of the primary winding to the secondary winding, at the fundamental frequency, an impedance for each of the two transistors can be made available depending on the desired behavior of the amplifier apparatus. The even and odd harmonic frequency components that may arise due to non-linearity of the transistors during excitation of the high-frequency amplifier apparatus may be terminated by a more highly reflective termination in relation to the impedance of the fundamental wave, to convert less energy at these frequencies and to increase the efficiency. A more highly reflective termination for a harmonic frequency is a termination that has a higher reflection factor than that of the fundamental wave. A more highly reflective termination may be, for example, a short circuit or an idle state for the corresponding harmonic frequency. This may come about due to additional filters tuned to the corresponding harmonic frequency. The phase of the reflection factors can be selected such that the current and voltage waveforms at the transistors are shaped such that there is minimal overlap. Lower overlap of the current and the voltage waves means that power loss at the transistors is reduced.

In some implementations, the primary and the secondary winding are coupled to one another vertically. The coupling may be influenced by the spacing and the material there between. In some examples, the primary winding may be arranged below the secondary winding.

In certain embodiments, the transistors are arranged in a common housing. For example, the transistors can be arranged in an assembly (package). This results in a compact construction and lower manufacturing complexity.

In some implementations, the vertical spacing between the primary winding and the secondary winding is less than half the width of a conductor path from which the primary winding or the secondary winding is formed. This achieves a compromise between increased magnetic coupling (small spacing) and reduced capacitive coupling (large spacing).

The lowermost layer of the multi-layered circuit board can be a metal layer that is used as a reference ground. This metal layer can also be used to produce good heat transfer to a cooling plate. Therefore, the circuit board can be arranged on a metal cooling plate.

In some implementations, the vertical spacing between the primary winding and secondary winding of the power transformer and the lowermost layer of the circuit board are greater than the spacing between the primary winding and the secondary winding. This arrangement in these implementations can ensure that the capacitance per unit length to ground of the layers in which the windings are arranged and the capacitive coupling between the layers in which the windings are arranged is low enough for the desired matching behavior, i.e., the ideal transformation. It also ensures the thermal resistance to the cooling plate is low enough for it to be possible for losses in the primary winding and the secondary winding to be conducted away towards the cooling plate.

In some implementations, the horizontal extensions of the primary winding and the secondary winding in the horizontal longitudinal direction and the horizontal transverse direction of the circuit board are less than λ/30 in each case, where λ is the wavelength of the high-frequency signal generated by the high-frequency amplifier apparatus.

In some implementations, a capacitance, such as a capacitor, is connected in parallel with the primary winding and the secondary winding of the power transformer. This capacitance, for example designed as a concentrated condenser, together with the respective self-inductances of the primary winding or the secondary winding, may constitute a high impedance, and for example close to the parallel resonance, at the fundamental frequency. On the primary side of the power transformer, this capacitance can be formed, in part, from the output capacitance of the transistor. The parallel capacitance on the primary side may furthermore be composed of a combination of differential mode capacitance between the two drains or collectors of the transistor pair and the common mode capacitances of each of the two drains or collectors in the direction of ground.

In some implementations, the primary winding can be symmetrical, such that the primary side has the same load for both transistors. This arrangement results in a high-resistance termination compared with the fundamental wave impedance, such that a second harmonic is loaded in a high-resistance manner during common mode excitation.

The number of windings for the primary winding and the secondary winding of the power transformer can be selected such that a desired impedance transformation is produced. For example, the ratio of the number of windings may be 1:2. For example, the primary winding can have one winding and the secondary winding can have two windings.

In some embodiments, the primary winding of the power transformer can include a center tap for supplying DC power to the transistors.

In some implementations, a network having an inductor and/or a capacitor is connected to the center tap. This means that even harmonics can be terminated in these implementations. In some examples, a series connection consisting of this network and half of the primary winding at the center tap are designed with a high resistance for double the fundamental frequency.

In some implementations, the drains or collectors of the transistors are connected by a series connection comprising an inductor and a capacitor. The capacitor can be a concentrated or distributed capacitor. The series connection of the inductor and the capacitor can be dimensioned such that a low-resistance termination is achieved at the third harmonic of the fundamental frequency. Quantitatively, a termination that has low resistance compared with the fundamental frequency impedance can thus be implemented.

The inductor in the series connection can be designed as a planar inductor on an upper layer of the circuit board. Here, the lowermost layer of the circuit board in turn serves as a ground layer, and is a low-resistance heat path for the power loss towards the cooling plate.

In some implementations, a signal transformer is provided to drive the transistors. The secondary winding of the signal transformer is connected at a first end to the gate or base terminal of one transistor, and is connected at a second end to the gate or base terminal of the other transistor.

In some implementations, harmonics higher than the fourth harmonic have only a minimal effect on the power of the high-frequency amplifier apparatus. Optionally, they can be connected directly to the drains or collectors towards ground in a low-resistance manner by a capacitor in each case. In this way, excitation of parasitic resonances by very high harmonics can be prevented, and stability can be considerably improved.

A high-frequency excitation apparatus according to some implementations of the invention is suitable for generating an approximately semi-sinusoidal voltage curve and an approximately rectangular current curve. This corresponds to inverse class F operation or, depending on the selection of the fundamental wave impedance and the corresponding harmonics, to a case from the inverse class F continuum.

Further features and advantages of the invention can be found in the following detailed description of embodiments of the invention, by way of the figures of the drawings, and from the claims. The features shown therein are not necessarily to scale. The various features may each be implemented in isolation or together in any desired combination in variants of the invention.

The schematic drawings show embodiments of the invention in various stages of use, and said embodiments are explained in detail in the following description.

DETAILED DESCRIPTION

Figure 1:
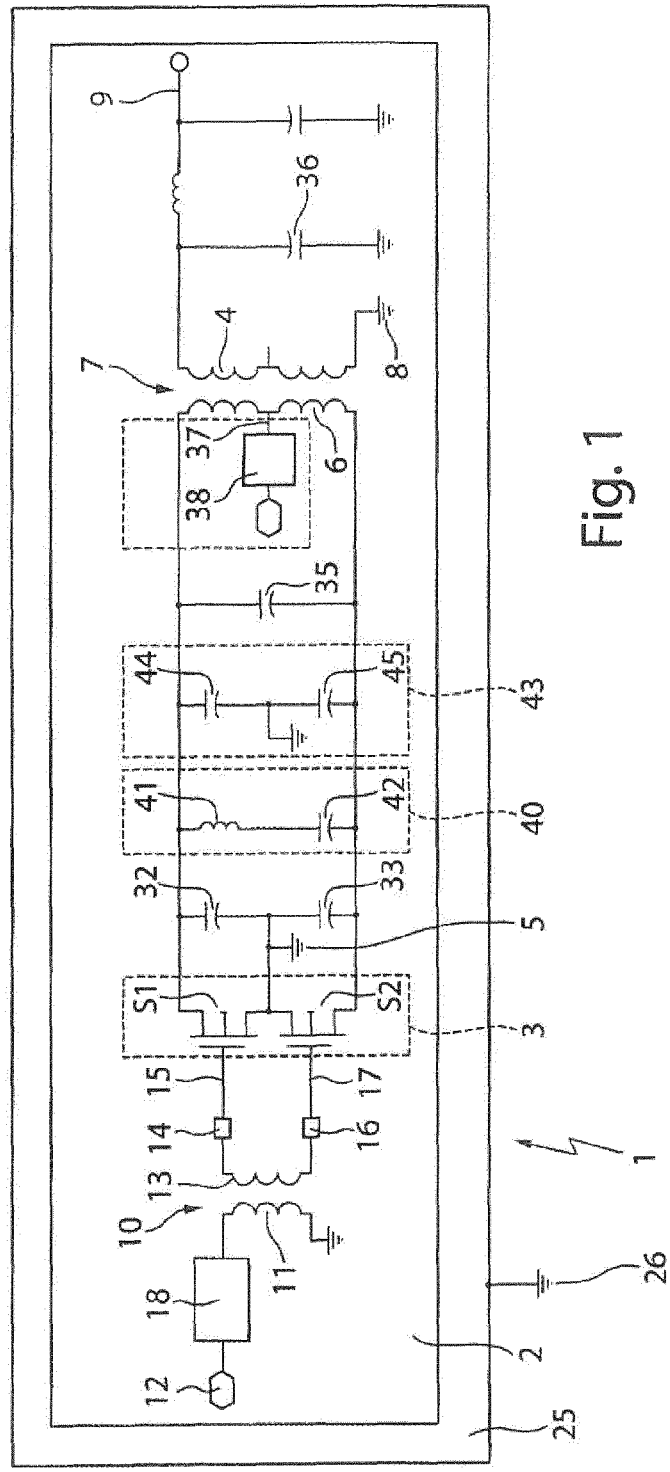
FIG. 1 is a schematic circuit diagram of a high-frequency amplifier apparatus, according to one embodiment of the invention.

The circuit diagram of FIG. 1 shows a first embodiment of a high-frequency amplifier apparatus 1. The high-frequency amplifier apparatus 1 includes a circuit board 2, on which a package 3 is arranged. The circuit board 2 may be a multi-layered circuit board. The package 3 comprises two transistors S1, S2 that are designed as LDMOS transistors, are embodied alike, and are each connected to a ground connection point 5 by their respective source terminals. The package 3 may be arranged on a substrate. The package 3 can be arranged in a housing. The housing of the package 3 can be arranged in a cut-out in the circuit board 2. The terminals of the package 3 can be contacted on the circuit board 2.

The transistors S1, S2 are each connected to one end of a primary winding 6 of a power transformer 7 that is part of an output network by the drain terminals thereof. The secondary winding 4 of the power transformer 7 is connected both to ground 8 and to a high-frequency output 9.

The source terminals of the transistors S1, S2 are each connected to ground by a capacitor 32, 33. This connection is made by a through-contact or via in the heat distributor of the transistors S1, S2.

The high-frequency amplifier apparatus 1 also includes a signal transformer 10, which comprises a primary winding 11 that is connected to a high-frequency input 12 by a matching network 18, for example. The secondary winding 13 of the signal transformer 10 is connected to the gate terminal 15 of the transistor S1 by a resistive element 14, for example a resistor. The secondary winding 13 is also connected to the gate terminal 17 of the transistor S2 by a resistive element 16, for example a resistor. The resistive elements 14, 16 and the secondary winding 13 are therefore connected in series. The signal transformer 10 is likewise arranged on the circuit board 2, in the same way as the power transformer 7.

The circuit board 2 lies flat on a cooling plate 25, which can likewise be connected to ground 26. The package 3 can be mounted on a copper plate for the purpose of cooling. The copper plate can be used for transferring heat from the package 3 to the cooling plate 25, and for example, for heat distribution. The copper plate may be arranged in the same cut-out in the circuit board 2 as the package 3 is arranged. The copper plate may have a larger surface than the surface of the package 3 that faces the cooling plate 25. The cut-out may be stepped, to match the circuit board to the surfaces of the copper plate and the package 3.

FIG. 1 also shows that a capacitor 35 is provided in parallel with the primary winding 6 of the power transformer 7. A capacitor 36 is likewise provided in parallel with the secondary winding 4 of the power transformer 7.

The primary winding 6 of the power transformer 7 comprises a center tap 37 for supplying DC power to the transistors S1, S2. A network 38, which may comprise an inductor and/or a capacitor, is connected to the center tap 37. For example, a series connection consisting of a capacitor and an inductor can be provided. Alternatively, a capacitor to ground and a series of inductors could be provided.

The drains or collectors of the transistors S1, S2 are connected by a series connection 40 comprising an inductor 41 and a capacitor 42. This series connection 40 serves as a low-resistance termination of the third harmonic.

Optionally, a matching network 43 may also be provided, which comprises two capacitors 44, 45, the connection point of which is connected to ground. Therefore, the primary winding 6 of the power transformer 7 can be tuned.

Figure 2:
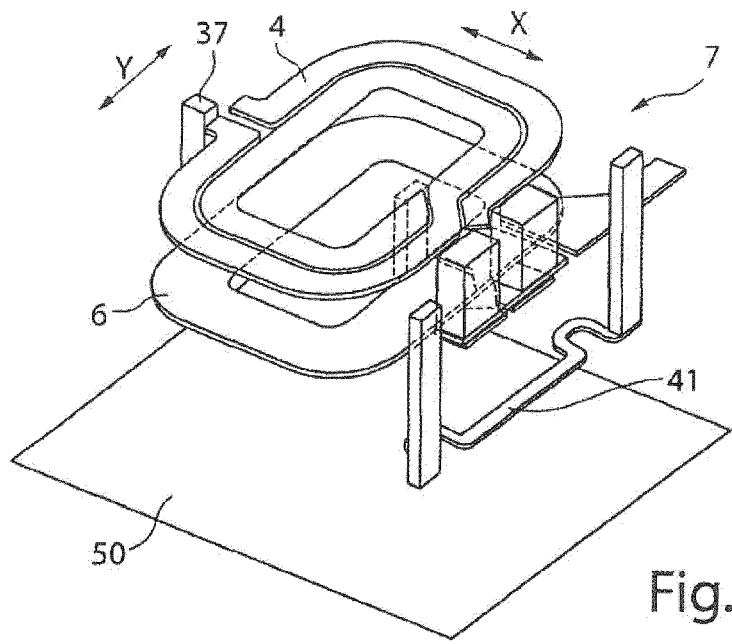
FIG. 2 is a perspective view of a planar power transformer, according to one implementation of the invention.

FIG. 2 shows the power transformer 7, according to an embodiment. The primary winding 6 is arranged below the secondary winding 4. Here, the primary winding 6 comprises one winding, while the secondary winding 4 comprises two windings. The primary winding 6 and the secondary winding 4 occupy approximately the same surface area. Here, the extension in the x direction and in the y direction, i.e. in the longitudinal direction and transverse direction of the circuit board 2, is less than $\lambda/30$ in each case, where $\lambda$ is the wavelength of the high-frequency signal to be generated. It should also be noted that the primary winding 6 comprises a center tap 37. The center tap 37 is not connected to the secondary winding 4.

Both the primary winding 6 and the secondary winding 4 are arranged in the upper layers of the circuit board. For example, they are arranged above a lower layer 50 of the circuit board. FIG. 2 also shows that the primary winding 6 and the secondary winding 4 are each formed by conductor paths. FIG. 2 also shows the planar inductor 41, which is likewise arranged in a layer of the circuit board 2, but is above the layer 50.

Figure 3:
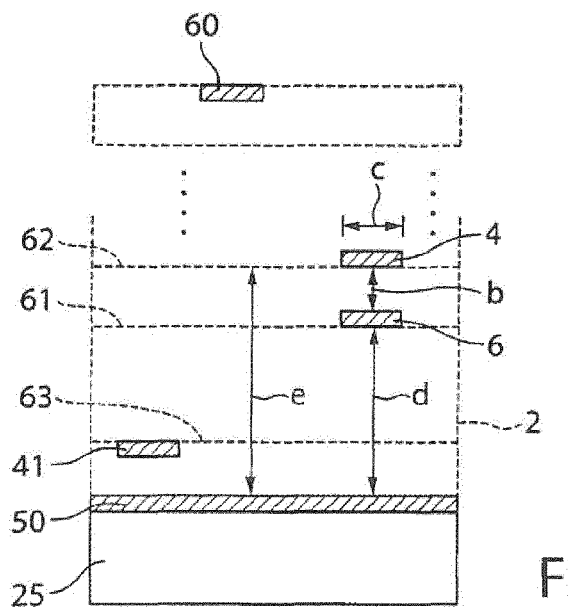
FIG. 3 is a schematic diagram illustrating a sectional view through a circuit board of a high-frequency amplifier apparatus, according to one implementation of the invention.

FIG. 3 is a sectional view through a circuit board 2, according to an embodiment of the invention. Connector pads 60 for connecting separate components are provided on the upper face of the circuit board 2. Corresponding connector pads could also be arranged on the layer 62. The lowermost layer 50 of the circuit board 2 is metal and planar. It constitutes a ground plate and is connected to a cooling plate 25 over a large surface area. The primary winding 6 and the secondary winding 4 are arranged in upper layers 61, 62 of the circuit board. Here, the spacing b between the primary winding 6 and the secondary winding 4 is preferably less than half the width c of a conductor path of the primary winding 6 or the secondary winding 4. The spacing d between the primary winding 6 and the layer 50 and also the spacing e between the secondary winding 4 and the layer 50 are each greater than the spacing b. Connection lines and also the planar inductor 41 may be provided in the layer 63.

Figure 4:
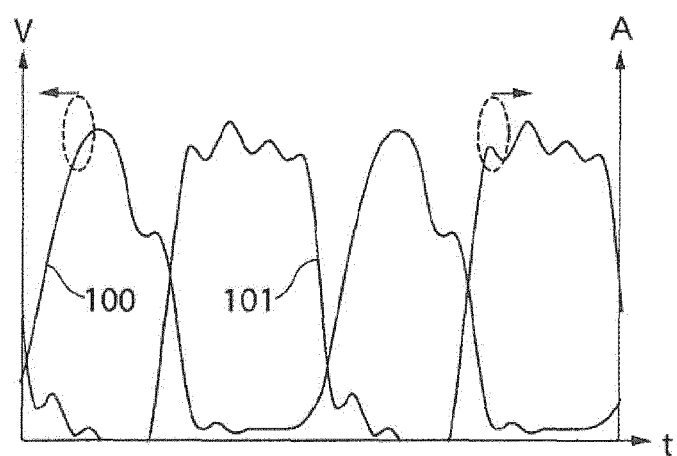
FIG. 4 is a graph that shows current and voltage curves that arise at the transistors of the high-frequency amplifier apparatus, according to one implementation of the invention.

FIG. 4 is a graph that shows an improvement in the efficiency of, and a reduction in the heat generation by, a high-frequency amplifier, according to an implementation of the invention. The voltage and current curves 100, 101, respectively, arise at the transistors S1, S2 when the high-frequency amplifier apparatus 1 is correctly tuned, e.g. by taking into account the factors explained herein. As illustrated, the voltage curve 100 is approximately semi-sinusoidal and the current curve 101 is substantially rectangular. The voltage curve 100 and the current curve 101 only overlap slightly. This slight overlap indicates that only a small amount of power is transformed into heat at the transistors S1, S2.

Other Embodiments

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A high-frequency amplifier apparatus comprising:
   two transistors, each having a first terminal and a second terminal that is connected to a ground connection point, wherein the two transistors are embodied alike and are arranged on a multi-layered circuit board that comprises a plurality of upper layers above a lowermost layer; and
   a power transformer having a primary winding and a secondary winding, wherein the primary winding is connected to the first terminals of the two transistors;
   wherein the primary winding and the secondary winding of the power transformer are each designed as planar conductor paths that are arranged in different layers of the plurality of upper layers of the multi-layered circuit board, and
   wherein the lowermost layer of the multi-layered circuit board is a metal layer that is used as a reference ground.

2. The apparatus of claim 1, wherein the first terminals are drain terminals and the second terminals are source terminals.

3. The apparatus of claim 1, wherein the primary winding and the secondary winding are coupled to one another vertically.

4. The apparatus of claim 1, wherein the two transistors are arranged in a common housing.

5. A high-frequency amplifier apparatus comprising:
   two transistors, each having a first terminal and a second terminal that is connected to a ground connection point, wherein the two transistors are embodied alike and are arranged on a multi-layered circuit board that comprises a plurality of upper layers above a lowermost layer; and a power transformer having a primary winding and a secondary winding, wherein the primary winding is connected to the first terminals of the two transistors, wherein the primary winding and the secondary winding of the power transformer are each designed as planar conductor paths that are arranged in different layers of the plurality of upper layers of the multi-layered circuit board, and wherein at least one of the primary winding and the secondary winding is formed by a conductor path with a width, and the primary winding is distanced from the secondary winding by a vertical spacing that is less than half the width of the conductor path.

6. A high-frequency amplifier apparatus comprising:
two transistors, each having a first terminal and a second terminal that is connected to a ground connection point, wherein the two transistors are embodied alike and are arranged on a multi-layered circuit board that comprises a plurality of upper layers above a lowermost layer; and
a power transformer having a primary winding and a secondary winding, wherein the primary winding is connected to the first terminals of the two transistors;
wherein the primary winding and the secondary winding of the power transformer are each designed as planar conductor paths that are arranged in different layers of the plurality of upper layers of the multi-layered circuit board, and
wherein the circuit board is arranged on a metal cooling plate.

7. A high-frequency amplifier apparatus comprising:
two transistors, each having a first terminal and a second terminal that is connected to a ground connection point, wherein the two transistors are embodied alike and are arranged on a multi-layered circuit board that comprises a plurality of upper layers above a lowermost layer; and
a power transformer having a primary winding and a secondary winding, wherein the primary winding is connected to the first terminals of the two transistors;
wherein the primary winding and the secondary winding of the power transformer are each designed as planar conductor paths that are arranged in different layers of the plurality of upper layers of the multi-layered circuit board, and
wherein a primary vertical spacing between the primary winding and the lowermost layer of the circuit board, and a secondary vertical spacing between the secondary winding and the lowermost layer of the circuit board are greater than a spacing between the primary winding and the secondary winding.

8. A high-frequency amplifier apparatus comprising:
two transistors, each having a first terminal and a second terminal that is connected to a ground connection point, wherein the two transistors are embodied alike and are arranged on a multi-layered circuit board that comprises a plurality of upper layers above a lowermost layer; and
a power transformer having a primary winding and a secondary winding, wherein the primary winding is connected to the first terminals of the two transistors;
wherein the primary winding and the secondary winding of the power transformer are each designed as planar conductor paths that are arranged in different layers of the plurality of upper layers of the multi-layered circuit board, and wherein extensions of the primary winding and the secondary winding in each of horizontal longitudinal direction and horizontal transverse direction of the circuit board are less than one thirtieth of a wavelength of a high-frequency signal generated by the high-frequency amplifier apparatus.

9. The apparatus of claim 1, further comprising:
a first capacitor connected in parallel with the primary winding; and
a second capacitor connected in parallel with the secondary winding.

10. The apparatus of claim 1, wherein the primary winding of the power transformer comprises a center tap for supplying a DC power to the two transistors.

11. The apparatus of claim 10, further comprising a network having at least one of an inductor and a capacitor, the network being connected to the center tap.

12. A high-frequency amplifier apparatus comprising:
two transistors, each having a first terminal and a second terminal that is connected to a ground connection point, wherein the two transistors are embodied alike and are arranged on a multi-layered circuit board that comprises a plurality of upper layers above a lowermost layer; and
a power transformer having a primary winding and a secondary winding, wherein the primary winding is connected to the first terminals of the two transistors,
wherein the primary winding and the secondary winding of the power transformer are each designed as planar conductor paths that are arranged in different layers of the plurality of upper layers of the multi-layered circuit board, and
wherein the first terminals of the two transistors are connected by a series connection comprising an inductor and a capacitor.

13. The apparatus of claim 12, wherein the inductor is embodied as a planar inductor on an upper layer of the circuit board.

14. The apparatus of claim 1, further comprising a signal transformer, wherein a winding of the signal transformer has a first end and a second end, wherein the first end is connected to a first gate terminal of one of the two transistors, and wherein the second end is connected to a second gate terminal of the other of the two transistors.

15. The apparatus of claim 6, wherein the first terminals are drain terminals and the second terminals are source terminals.

16. The apparatus of claim 6, wherein the primary winding and the secondary winding are coupled to one another vertically.

17. The apparatus of claim 6, wherein the two transistors are arranged in a common housing.

18. The apparatus of claim 12, wherein the primary winding and the secondary winding are coupled to one another vertically.

19. The apparatus of claim 12, wherein the two transistors are arranged in a common housing.

* * * * *